(12) United States Patent
Tai et al.

(10) Patent No.: US 12,269,735 B2
(45) Date of Patent: Apr. 8, 2025

(54) DIELECTRIC PROTECTION LAYER CONFIGURED TO INCREASE PERFORMANCE OF MEMS DEVICE

(71) Applicant: Taiwan Semiconductor Manufacturing Company, Ltd., Hsinchu (TW)

(72) Inventors: Wen-Chuan Tai, Hsinchu (TW); Hsiang-Fu Chen, Zhubei (TW); Chia-Ming Hung, Taipei (TW); I-Hsuan Chiu, Taipei (TW); Fan Hu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 235 days.

(21) Appl. No.: 17/825,225

(22) Filed: May 26, 2022

(65) Prior Publication Data
US 2023/0382724 A1    Nov. 30, 2023

(51) Int. Cl.
*B81C 1/00* (2006.01)
*B81B 3/00* (2006.01)

(52) U.S. Cl.
CPC ........ *B81C 1/00801* (2013.01); *B81B 3/0051* (2013.01); *B81B 2203/0127* (2013.01); *B81C 2201/053* (2013.01)

(58) Field of Classification Search
CPC ...... B81C 2201/053; B81C 2201/0132; B81C 2201/0133; B81C 1/00801; B81B 3/0051; B81B 2203/0127; H01L 21/28247
See application file for complete search history.

(56) References Cited

U.S. PATENT DOCUMENTS

| | | |
|---|---|---|
| 2011/0012247 A1 | 1/2011 | Wu |
| 2019/0206739 A1* | 7/2019 | Wang ............... H01L 29/42376 |
| 2020/0006128 A1* | 1/2020 | Weng ................. H01L 23/3171 |
| 2020/0067425 A1 | 2/2020 | Tsai et al. |
| 2020/0239298 A1 | 7/2020 | Hsieh et al. |
| 2021/0061647 A1* | 3/2021 | Chen .................. B81C 1/00246 |

* cited by examiner

*Primary Examiner* — Moazzam Hossain
(74) *Attorney, Agent, or Firm* — Eschweiler & Potashnik, LLC

(57) ABSTRACT

Various embodiments of the present disclosure are directed towards an integrated chip including an interconnect structure overlying a semiconductor substrate. An upper dielectric structure overlies the interconnect structure. A microelectromechanical system (MEMS) substrate overlies the upper dielectric structure. A cavity is defined between the MEMS substrate and the upper dielectric structure. The MEMS substrate comprises a movable membrane over the cavity. A cavity electrode is disposed in the upper dielectric structure and underlies the cavity. A plurality of stopper structures is disposed in the cavity between the movable membrane and the cavity electrode. A dielectric protection layer is disposed along a top surface of the cavity electrode. The dielectric protection layer has a greater dielectric constant than the upper dielectric structure.

20 Claims, 10 Drawing Sheets

DIELECTRIC PROTECTION LAYER CONFIGURED TO INCREASE PERFORMANCE OF MEMS DEVICE

BACKGROUND

Microelectromechanical systems (MEMS) devices, such as accelerometers, pressure sensors, microphones, and transducers, have found widespread use in many modern-day electronic devices. For example, MEMS accelerometers and transducers are commonly found in automobiles (e.g., in airbag deployment systems), tablet computers, or in medical devices. MEMS devices may have a moveable part, which is used to detect a motion, and convert the motion to an electrical signal. For example, a MEMS accelerometer includes a moveable part that transfers accelerating movement to an electrical signal. A transducer includes a moveable membrane that transfers sound waves to an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
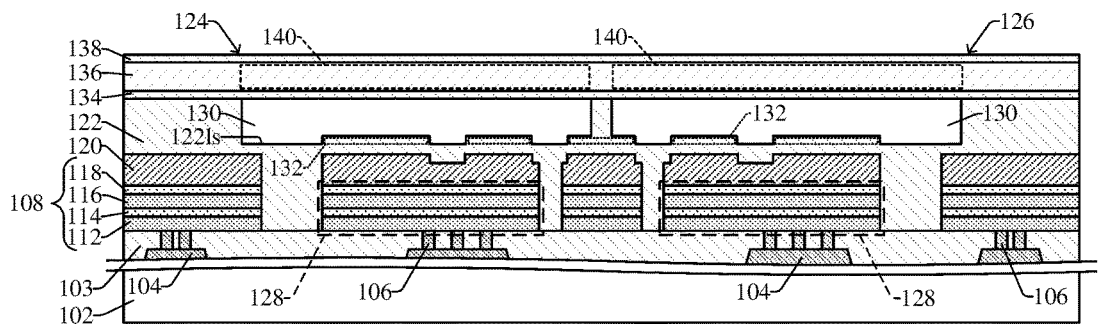
FIG. 1 illustrates a cross-sectional view of some embodiments of an integrated chip comprising a dielectric protection layer disposed between a cavity electrode and a movable membrane.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip may comprise a microelectromechanical systems (MEMS) device having a movable membrane disposed above and/or within a cavity. A cavity electrode is disposed within and/or below the cavity. The MEMS device may be used for acoustical applications (e.g., as a capacitive micro-machined ultrasonic transducer (CMUTs)) such that during operation sound waves may cause the movable membrane to move towards or away from the cavity electrode, whereby a change in capacitance may be detected between the movable membrane and cavity electrode. This change in capacitance may be converted into an electrical signal and may be transferred to an interconnect structure that is electrically coupled to the cavity electrode and/or movable membrane. A range of capacitance values that may be sensed by the MEMS device is defined, at least in part, by a height of the cavity (i.e., a sensing gap) and an effective dielectric constant between the movable membrane and the cavity electrode.

During fabrication of the MEMS device, a dielectric structure is formed over the cavity electrode and subsequently etched to define the height of the cavity. However, the dielectric structure may be etched in such a manner that a lower surface of the dielectric structure, that defines a bottom of the cavity, is substantially flat. The substantially flat lower surface of the dielectric structure increases a likelihood that the movable membrane may become stuck to the lower surface of the dielectric structure and render the MEMS device inoperable, thereby decreasing a reliability and/or endurance of the MEMS device. Further, the dielectric structure may comprise a dielectric material (e.g., silicon dioxide) disposed between the movable membrane and cavity electrode with a relatively low dielectric constant (e.g., a dielectric constant of about 3.9 or less) and/or with a relatively low thickness (e.g., less than about 300 angstroms). The dielectric material with the relatively low dielectric constant and/or relatively low thickness decreases an effective dielectric constant between the movable membrane and the cavity electrode. The decreased effective dielectric constant between the movable membrane and the cavity electrode reduces a range of capacitance values that may be sensed by the MEMS device, thereby reducing an overall performance (e.g., sensitivity) of the MEMS device)

The present disclosure, in some embodiments, relates to a MEMS device with a dielectric protection layer disposed on a cavity electrode and configured to increase performance of the MEMS device. The MEMS device comprises a movable membrane overlying a cavity and a cavity electrode disposed below the cavity. A dielectric protection layer extends along a top surface of the cavity electrode and is disposed between the movable membrane and the cavity electrode. The dielectric protection layer is configured to mitigate damage to the cavity electrode during fabrication of the MEMS device (e.g., mitigates damage during an etching process and/or a planarization process). Further, the dielectric protection layer is relatively thick (e.g., greater than about 300 angstroms) and comprises a dielectric material (e.g., silicon nitride) with a high dielectric constant (e.g., greater than 3.9), such that the dielectric protection layer increases an effective dielectric constant between the movable membrane and the cavity electrode. This increases a capacitance between the moveable membrane and cavity electrode, thereby increasing a range of capacitance values that may be sensed by the MEMS device. Furthermore, the MEMS device comprises a plurality of stopper structures disposed along a bottom of the cavity. The stopper structures are configured to decrease stiction between the movable membrane and surfaces of the cavity, thereby increasing an overall performance of the MEMS device.

FIG. 1 illustrates a cross-sectional view 100 of some embodiments of an integrated chip comprising a dielectric protection layer 120 disposed between a cavity electrode 128 and a movable membrane 140.

The integrated chip comprises a first microelectromechanical systems (MEMS) device 124 and a second MEMS device 126 overlying a semiconductor substrate 102. A plurality of conductive wires 104 and a plurality of conductive vias 106 are disposed within a lower dielectric structure 103 overlying the semiconductor substrate 102. Further, a stack of conductive layers 108 overlies the lower dielectric structure 103. In some embodiments, the stack of conductive layers 108 comprises a first conductive layer 112, a second conductive layer 114, a third conductive layer 116, and a fourth conductive layer 118. The stack of conductive layers 108 is disposed within an upper dielectric structure 122. The second conductive layer 114 is disposed along a top surface of the first conductive layer 112, the third conductive layer 116 is disposed along a top surface of the second conductive layer 114, and the fourth conductive layer 118 is disposed along a top surface of the third conductive layer 116. The dielectric protection layer 120 extends along a top surface of the stack of conductive layers 108.

A MEMS substrate 136 overlies the stack of conductive layer 108 and is disposed between a lower isolation structure 134 and an upper isolation structure 138. In various embodiments, the MEMS substrate 136 is bonded to the upper dielectric structure 122 by way of the lower isolation structure 134. In various embodiments, the first and second MEMS devices 124, 126 respectively comprise a movable membrane 140, a cavity 130, a plurality of stopper structures 132, and a cavity electrode 128. The movable membrane 140 is a portion of the MEMS substrate 136 directly overlying the cavity 130 and/or cavity electrode 128. Further, the cavity electrode 128 is a portion of the stack of conductive layers 108 directly underlying the cavity 130. A portion of the dielectric protection layer 120 is disposed directly between the cavity electrode 128 and the movable membrane 140. Further, the plurality of stopper structures 132 is disposed between the movable membrane 140 and the cavity electrode 128. In various embodiments, the stopper structures 132 are segments of the upper dielectric structure 122 that extend upward from a lower surface 122*ls* of the upper dielectric structure 122, where the lower surface 122*ls* of the upper dielectric structure 122 defines a bottom surface of the cavity 130. In further embodiments, the cavity 130 of the first MEMS device 124 may be separated from the cavity 130 of the second MEMS device 126 by a segment of the upper dielectric structure 122. Further, the cavity 130 of the first and second MEMS devices 124, 126 is defined by surfaces of the upper dielectric structure 122 and the lower isolation structure 134 and sidewalls of the upper dielectric structure 122.

The upper dielectric structure 122 may, for example, be or comprise an oxide, silicon dioxide, a low-k dielectric (e.g., a dielectric material with a dielectric constant less than about 3.9), some other suitable material(s), or any combination of the foregoing. The dielectric protection layer 120 may, for example, be or comprise a high-k dielectric (e.g., a dielectric material with a dielectric constant greater than about 3.9), silicon nitride, silicon carbide, aluminum oxide, tantalum oxide, titanium oxide, zirconium oxide, hafnium oxide, some other suitable dielectric material(s), or any combination of the foregoing. Thus, the dielectric protection layer 120 has a relatively high dielectric constant (e.g., a dielectric constant greater than about 3.9). The lower and upper isolation structures 134, 138 may, for example, respectively be or comprise an oxide, silicon dioxide, a low-k dielectric, some other suitable material(s), or any combination of the foregoing.

During operation of the first and second MEMS devices 124, 126, the movable membrane 140 is configured to move towards or away from the cavity electrode 128 in response to external stimuli such that a change in capacitance between the moveable membrane 140 and the cavity electrode 128 may be detected. The change in capacitance may be converted into an electrical signal and may be transferred to semiconductor devices (not shown) disposed in/on the semiconductor substrate 102 by way of the plurality of conductive wires 104 and/or conductive vias 106. For example, a position of the movable membrane 140 may be displaced due to a sound wave disposed upon the MEMS substrate 136. In various embodiments, the first and second MEMS devices 124, 126 may, for example be configured as a capacitive micro-machined ultrasonic transducer (CMUT), a pressure sensor, a motion sensor, or some other suitable device(s).

In various embodiments, a range of capacitance values that may be sensed by the first and second MEMS devices 124, 126 may be defined, at least in part, by an effective dielectric constant between the movable membrane 140 and the cavity electrode 128. The effective dielectric constant between the movable membrane 140 and the cavity electrode 128 is a function of the dielectric materials between the movable membrane 140 and the cavity electrode 128 and the physical structure of the dielectric materials. For example, by virtue of the dielectric protection layer 120 having the relatively high dielectric constant (e.g., greater than about 3.9) and being disposed along a top surface of the cavity electrode 128, the effective dielectric constant between the movable membrane 140 and the cavity electrode 128 is increased. This, in part, increases the capacitance between the movable membrane 140 and cavity electrode 128, thereby increasing a sensitivity of the MEMS devices 124, 126 (i.e., increasing the range of capacitance values that may be sensed by the MEMS devices 124, 126). Accordingly, the material, structure, and layout of the dielectric protection layer 120 increases an overall performance of the integrated chip. In further embodiments, the dielectric protection layer 120 may be referred to as a sensitivity enhancement layer.

The plurality of stopper structures 132 abuts the cavity 130 of the first and second MEMS devices 124, 126. During operation of the first and second MEMS devices 124, 126, the stopper structures 132 are configured to prevent the movable membrane 140 from becoming stuck to and/or attached to surface(s) that define the cavity 130 (e.g., surface(s) of the upper dielectric structure 122). In various embodiments, each of the stopper structures 132 may have a rough upper surface (e.g., an upper surface having a saw-tooth profile) configured to prevent stiction with the movable membrane 140 and/or the lower isolation structure 134. This may prevent the movable membrane 140 from becoming stuck and/or unable to move in response to external stimuli, thereby increasing a reliability and performance of the first and second MEMS devices 124, 126.

Figure 2:
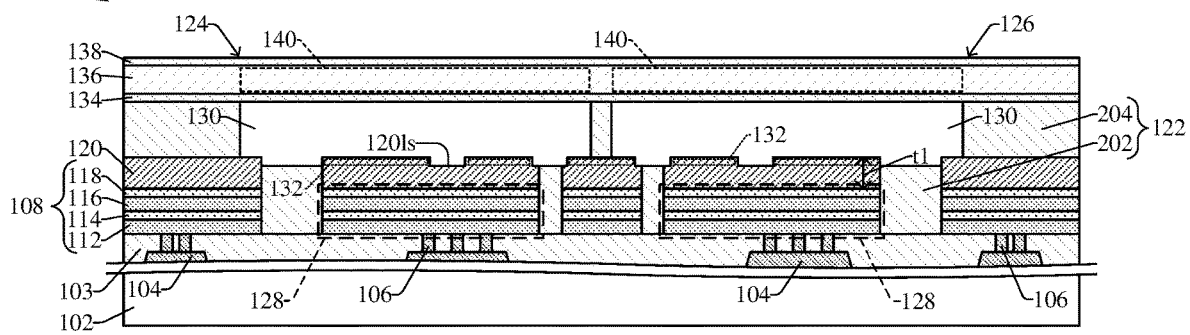
FIGS. 2 and 3 illustrate cross-sectional views of some other embodiments of the integrated chip of FIG. 1.

FIG. 2 illustrates a cross-sectional view 200 of some other embodiments of the integrated chip of FIG. 1.

The integrated chip includes the plurality of conductive wires 104 and the plurality of conductive vias 106 disposed over the semiconductor substrate 102. The semiconductor substrate 102 may, for example, be or comprise a bulk substrate (e.g., a bulk silicon substrate), a silicon-on-insulator (SOI) substrate, or some other suitable substrate. The plurality of conductive wires 104 and the plurality of conductive vias 106 are disposed within the lower dielectric structure 103. The lower dielectric structure 103 may comprise one or more inter-metal dielectric (IMD) layers. The one or more IMD layers may, for example, be or comprise silicon dioxide, a low-k dielectric material, an extreme low-k dielectric material, other dielectric material(s), or any combination of the foregoing. The conductive wires and/or vias 104, 106 may, for example, be or comprise aluminum, copper, tungsten, iridium, some other conductive material(s), or any combination of the foregoing An upper dielectric structure 122 overlies the lower dielectric structure 103. In various embodiments, the upper dielectric structure 122 comprises a first dielectric layer 202 and a second dielectric layer 204. A stack of conductive layers 108 and dielectric protection layer 120 are disposed in the first dielectric layer 202. The first and second dielectric layers 202, 204 may, for example, be or comprise an oxide, silicon dioxide, a low-k dielectric, some other suitable material(s), or any combination of the foregoing. In some embodiments, the stack of conductive layers 108 comprises a first conductive layer 112, a second conductive layer 114, a third conductive layer 116, and a fourth conductive layer 118. In various embodiments, the first and third conductive layers 112, 116 comprise a first conductive material (e.g., titanium), and the second and fourth conductive layers 114, 118 comprise a second conductive material (e.g., titanium nitride) different from the first conductive material. The first and third conductive layers 112, 116 may, for example, be or comprise titanium, tantalum, some other conductive material(s), or any combination of the foregoing. The second and fourth conductive layers 114, 118 may, for example, be or comprise titanium nitride, tantalum nitride, some other conductive material(s), or any combination of the foregoing.

The dielectric protection layer 120 continuously extends along a top surface of the stack of conductive layers 108. The dielectric protection layer 120 may, for example, be or comprise a high-k dielectric (e.g., a dielectric material with a dielectric constant greater than about 3.9), silicon nitride, silicon carbide, aluminum oxide, tantalum oxide, titanium oxide, zirconium oxide, hafnium oxide, some other suitable dielectric material(s), or any combination of the foregoing. Further, a thickness t1 of the dielectric protection layer 120 is, for example, within a range of about 300 angstroms to 1,500 angstroms, 1,000 angstroms to about 25,000 angstroms or some other suitable value. In various embodiments, by virtue of the thickness t1 being relatively thick (e.g., greater than about 300 angstroms), an effective dielectric constant between the movable membrane 140 and the cavity electrode 128 may be sufficiently increased. In further embodiments, by virtue of the thickness t1 being less than 25,000 angstroms, a sensing gap between the movable membrane 140 and the cavity electrode 128 may be accurately defined while maintaining low costs associated with fabrication of the integrated chip.

A MEMS substrate 136 overlies the upper dielectric structure 122 and is disposed between a lower isolation structure 134 and an upper isolation structure 138. The MEMS substrate 136 may, for example, be or comprise silicon, doped silicon, polysilicon, other suitable material(s), or any combination of the foregoing. A first MEMS device 124 and second MEMS device 126 are disposed over the semiconductor substrate 102. In various embodiments, the first and second MEMS devices 124, 126 respectively comprise a movable membrane 140, a cavity 130, a plurality of stopper structures 132, and a cavity electrode 128. In some embodiments, the movable membrane 140 is disposed within and/or on the MEMS substrate 136. For example, the movable membrane 140 may be a doped region of the MEMS substrate 136 comprising a first doping type (e.g., n-type). In another example, the movable membrane 140 may be or comprise a conductive electrode disposed within and/or on a surface of the MEMS substrate 136 (not shown). The MEMS substrate 136 may have a relatively low resistivity to facilitate detecting a change in capacitance between the movable membrane 140 and the cavity electrode 128. For example, the MEMS substrate 136 may, for example, have a resistance within a range between about 1 microohm-cm to about 0.1 ohm-cm, less than about 0.1 ohm-cm, or some other suitable value. The movable membrane 140 directly overlies the cavity 130 and/or the cavity electrode 128.

The cavity electrode 128 is a portion of the stack of conductive layers 108 directly underlying the cavity 130. In some embodiments, the cavity 130 of the first and second MEMS devices 124, 126 is defined by surface(s) of the dielectric protection layer 120, surface(s) of the upper dielectric structure 122, and a lower surface of the lower isolation structure 134. In various embodiments, the dielectric protection layer 120 abuts the cavity 130. Further, the plurality of stopper structures 132 is disposed between the movable membrane 140 and the cavity electrode 128. In some embodiments, the stopper structures 132 are segments of the dielectric protection layer 120 the extend upward from a lower surface 120 $1s$ of the dielectric protection layer 120. By virtue of the dielectric protection layer 120 being disposed along the top surface of the cavity electrode 128 and having the relatively high dielectric constant (e.g., greater than 3.9), the effective dielectric constant between the movable membrane 140 and the cavity electrode 128 may be increased, thereby increasing a sensitivity of the first and second MEMS devices 124, 126.

Figure 3:
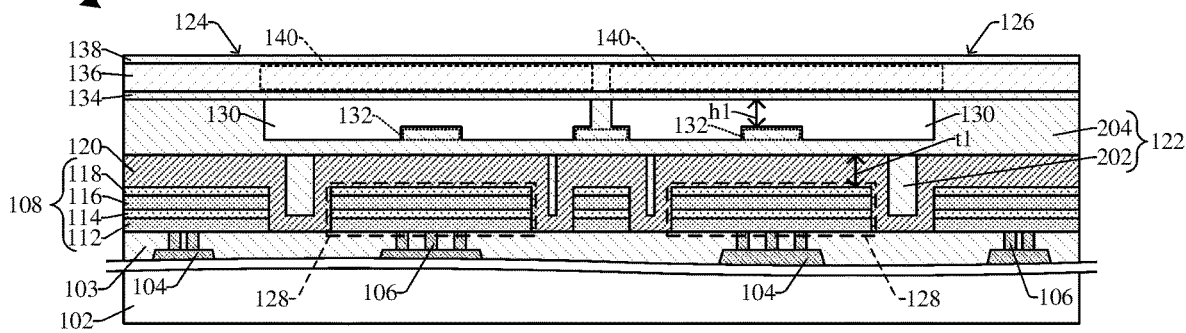

FIG. 3 illustrates a cross-sectional view 300 of some other embodiments of the integrated chip of FIG. 1, where the dielectric protection layer 120 continuously extends from a top surface of the cavity electrode 128 to opposing sidewalls of the cavity electrode 128.

In various embodiments, a bottom surface of the dielectric protection layer 120 is aligned with a bottom surface of the cavity electrode 128. Further, the upper dielectric structure 122 comprises a first dielectric layer 202 and a second dielectric layer 204. The first dielectric layer 202 is disposed between sidewalls of the dielectric protection layer 120. In some embodiments, a top surface of the first dielectric layer 202 is co-planar with a top surface of the dielectric protection layer 120. Further, the plurality of stopper structures 132 is disposed within the second dielectric layer 204 and directly overlies the cavity electrode 128. In various embodiments, the thickness t1 of the dielectric protection layer 120 is greater than a height h1 of the cavity 130 of the first and second MEMS devices 124, 126. In yet further embodiments, the dielectric protection layer 120 continuously laterally extends from the cavity electrode 128 of the first MEMS device 124 to the cavity electrode 128 of the second MEMS device 126. In some embodiments, the thickness t1 of the dielectric protection layer 120 is greater than a thickness of the upper dielectric structure 122 directly above the cavity electrode 128, thereby facilitating the increase of the effective dielectric constant between the moveable membrane 140 and the cavity electrode 128.

Figure 4:
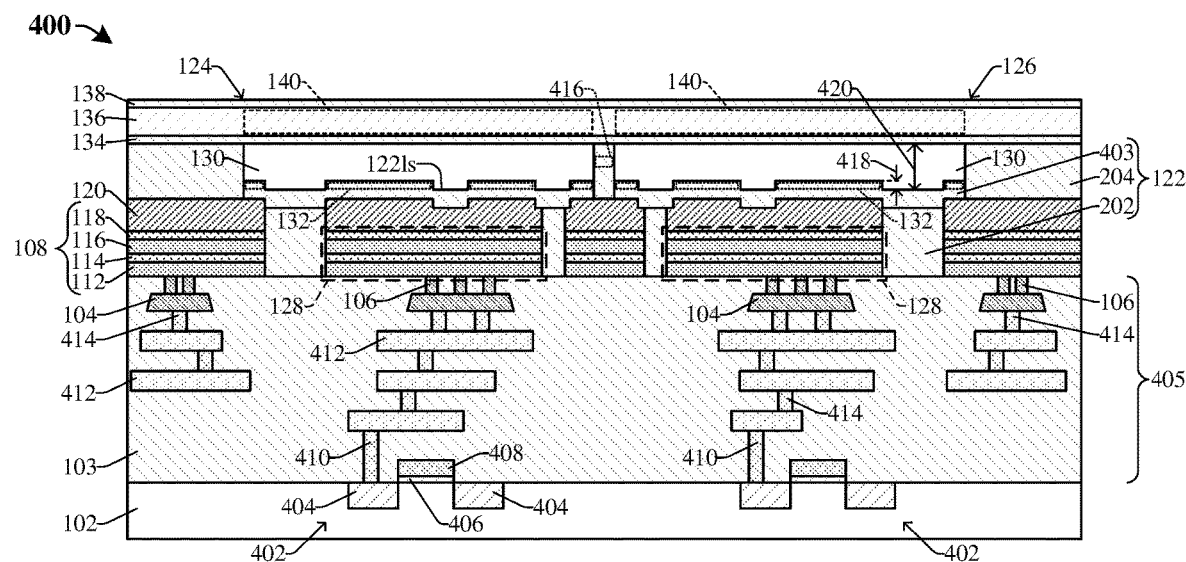
FIG. 4 illustrates a cross-sectional view of some embodiments of an integrated chip comprising a first MEMS device and a second MEMS device overlying a plurality of semiconductor devices.

FIG. 4 illustrates a cross-sectional view 400 of some embodiments of an integrated chip comprising a first and second MEMS devices 124, 126 overlying a plurality of semiconductor devices 402 disposed within and/or on a semiconductor substrate 102. It will be appreciated that, in some embodiments, the first and second MEMS devices 124, 126 of FIG. 4 may be configured as the first and second MEMS devices 124, 126 of FIG. 1, 2, or 3.

In some embodiments, the integrated chip of FIG. 4 comprises an interconnect structure 405 overlying the semiconductor substrate 102 and a plurality of semiconductor devices 402 disposed within and/or on the semiconductor substrate 102. In various embodiments, the semiconductor devices 402 may be a metal-oxide-semiconductor field-effect transistor (MOSFET) comprising a pair of source/drain regions 404 disposed in the semiconductor substrate 102, a gate dielectric layer 406 overlying the semiconductor substrate 102, and a gate electrode 408 disposed on the gate dielectric layer 406 and between the source/drain region 404. The interconnect structure 405 comprises a plurality of conductive contacts 410, a plurality of lower conductive wires 412, a plurality of lower conducive vias 414, the plurality of conductive wires 104, and the plurality of conductive vias 106 disposed within the lower dielectric structure 103. The interconnect structure 405 is configured to electrically couple the plurality of semiconductor devices 402 to the first and second MEMS devices 124, 126.

In further embodiments, the upper dielectric structure 122 comprises the first dielectric layer 202, the second dielectric layer 204, and a third dielectric layer 403. The third dielectric layer 403 may, for example, be or comprise an oxide, silicon dioxide, a low-k dielectric, some other suitable material(s), or any combination of the foregoing. Further, the plurality of stopper structure 132 are disposed within the third dielectric layer 403. In some embodiments, a height 418 of the stopper structures 132 is within a range of about 1 nanometer to 10 micrometers, or some other suitable value. A bottom of the cavity 130 may be defined by the lower surface 1221s of the upper dielectric structure 122 and top surfaces of the stopper structures 132. In yet further embodiments, an area of the stopper structures 132 may be about 2 percent to about 80 percent of a total area of the bottom of the cavity 130. A height 420 of the cavity 130, defined between the lower surface 1221s of the upper dielectric structure 122 and a bottom surface of the lower isolation structure 134, may, for example, be within a range of about 100 nanometers to about 10 micrometers, or some other suitable value.

In some embodiments, a fluid communication channel 416 is disposed in the upper dielectric structure 122 between the cavity 130 of the first MEMS device 124 to the cavity 130 of the second MEMS device 126. The fluid communication channel 416 is configured such that the cavity 130 of the first MEMS device 124 is in fluid communication with the cavity 130 of the second MEMS device 126. By virtue of the cavities 130 of the first and second MEMS devices 124, 126 being in fluid communication with one another, cavity pressures of the cavities 130 (e.g., pressures insides the cavities 130) are substantially the same. Because the cavity pressures are substantially the same, transmission and/or receiving sensitivity of the first and second MEMS devices 124, 126 may be improved.

Figure 5:
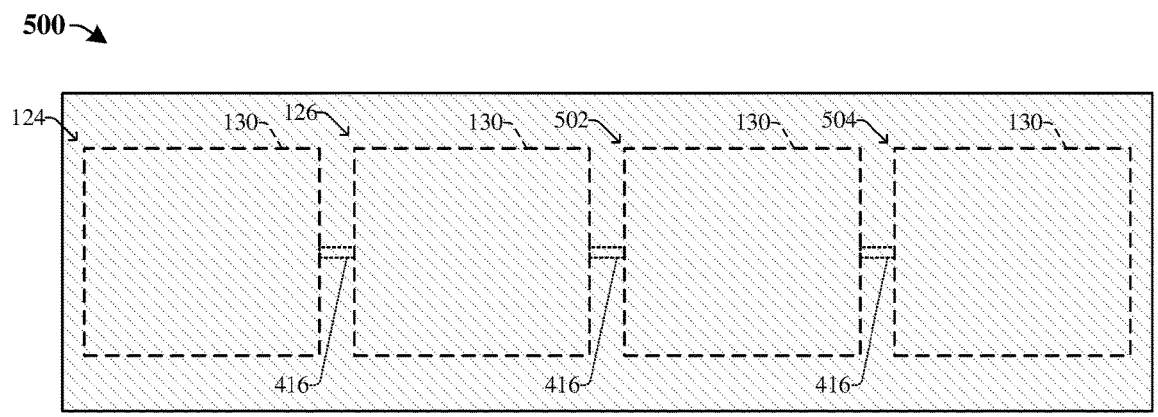
FIG. 5 illustrates a simplified layout view of some embodiments of the integrated chip of FIG. 4.

FIG. 5 illustrates a simplified layout view 500 of some embodiments of the integrated chip of FIG. 4. FIG. 5 is "simplified" because various features illustrated in FIG. 4 are not illustrated in FIG. 5.

As illustrated in FIG. 5, the first MEMS device 124 neighbors the second MEMS device 126, the second MEMS device 126 neighbors a third MEMS device 502, and the third MEMS device 502 neighbors a fourth MEMS device 504. Cavities 130 of the MEMS devices 124, 126, 502, 504 are in fluid connection with one another by way of a plurality of fluid communication channels 416.

FIGS. 6-15 illustrate cross-sectional views 600-1500 of some embodiments of a method for forming an integrated chip comprising a dielectric protection layer disposed along a top surface of a cavity electrode. Although the cross-sectional views 600-1500 shown in FIGS. 6-15 are described with reference to a method, it will be appreciated that the structures shown in FIGS. 6-15 are not limited to the method but rather may stand alone separate of the method. Furthermore, although FIGS. 6-15 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 6:
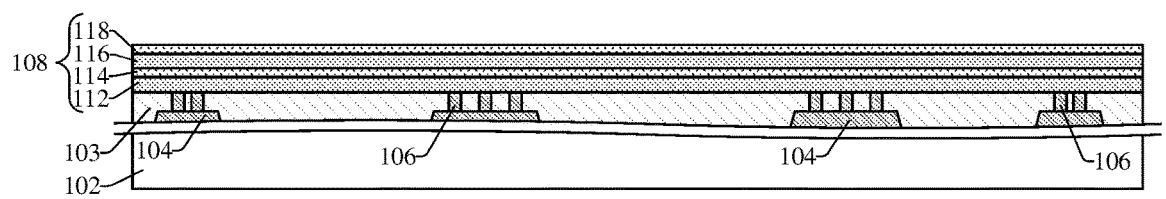
FIGS. 6-15 illustrate cross-sectional views of some embodiments of a method for forming an integrated chip comprising a dielectric protection layer disposed along a top surface of a cavity electrode.

As shown in cross-sectional view 600 of FIG. 6, a semiconductor substrate 102 is provided. A lower dielectric structure 103, plurality of conductive wires 106, and plurality of conductive vias 106 are formed over the semiconductor substrate 102. Further, a stack of conductive layers 108 is formed over the lower dielectric structure 103. The semiconductor substrate 102 may, for example, be or comprise a bulk substrate (e.g., a bulk silicon substrate), a SOI substrate, or some other suitable substrate. In some embodiments, the stack of conductive layers 108 comprises a first conductive layer 112, a second conductive layer 114, a third conductive layer 116, and a fourth conductive layer 118. A process for forming the stack of conductive layers 108 may include: depositing (e.g., by physical vapor deposition (PVD), chemical vapor deposition (CVD), atomic layer deposition (ALD), sputtering, or other deposition or growth process(es)) the first conductive layer 112 on the lower dielectric structure 103; depositing (e.g., by PVD, CVD, ALD, sputtering, or other deposition or growth process(es)) the second conductive layer 114 on the first conductive layer 112; depositing (e.g., by PVD, CVD, ALD, sputtering, or other deposition or growth process(es)) the third conductive layer 116 on the second conductive layer 114; and depositing (e.g., by PVD, CVD, ALD, sputtering, or other deposition or growth process(es)) the fourth conductive layer 118 on the third conductive layer 116. The first and third conductive layers 112, 116 may, for example, be or comprise titanium, tantalum, some other conductive material(s), or any combination of the foregoing. The second and fourth conductive layers 114, 118 may, for example, be or comprise titanium nitride, tantalum nitride, some other conductive material(s), or any combination of the foregoing.

Figure 7:
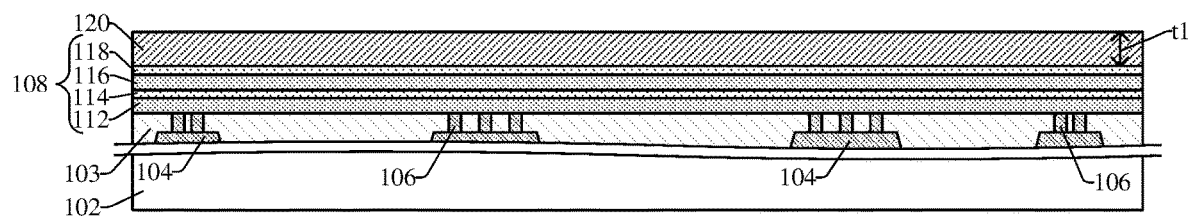

As shown in cross-sectional view 700 of FIG. 7, a dielectric protection layer 120 is formed over the stack of conductive layers 108. The dielectric protection layer 120 may, for example, be formed by CVD, PVD, ALD, or some other suitable deposition or growth process(es). The dielectric protection layer 120 may, for example, be or comprise a high-k dielectric (e.g., a dielectric material with a dielectric constant greater than about 3.9), silicon nitride, silicon carbide, aluminum oxide, tantalum oxide, titanium oxide, zirconium oxide, hafnium oxide, some other suitable dielectric material(s), or any combination of the foregoing. Further, the dielectric protection layer 120 may be formed to a thickness t1 that is, for example, within a range of about 300 angstroms to 1,500 angstroms, 1,000 angstroms to about 25,000 angstroms or some other suitable value.

Figure 8:
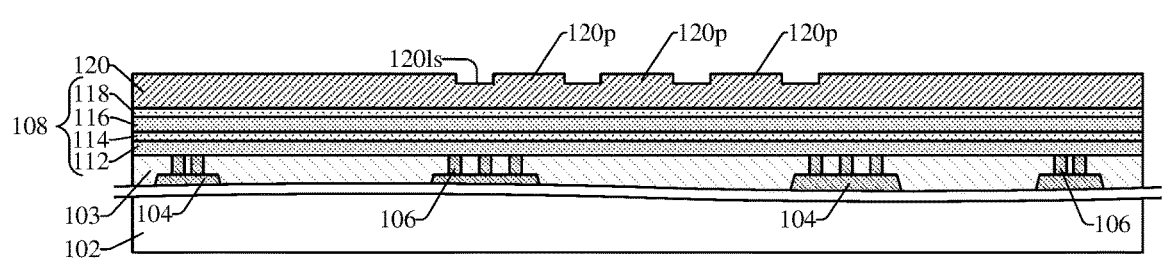

As shown in cross-sectional view 800 of FIG. 8, an etching process is performed on the dielectric protection layer 120 to form a plurality of protrusions 120*p* in the dielectric protection layer 120. In some embodiments, the etching process may include a dry etch process, a wet etch process, some other suitable etch process(es), or any combination of the foregoing. Further, the protrusions extend upward from a lower surface 1201*s* of the dielectric protection layer 120. In various embodiments, the plurality of protrusions 120*p* may be part of a plurality of stopper structures disposed within the dielectric protection layer 120 (e.g., see FIG. 2).

Figure 9:
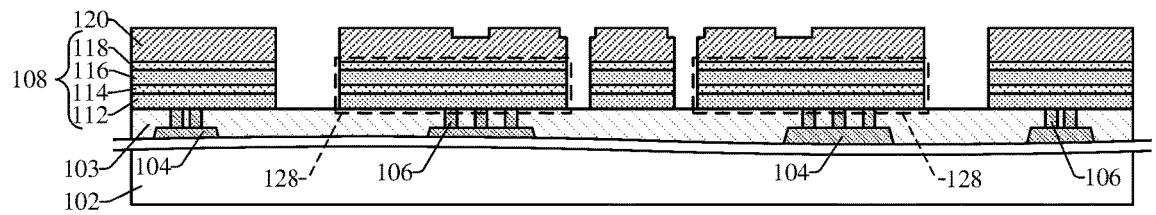

As shown in cross-sectional view 900 of FIG. 9, an etching process is performed on the dielectric protection layer 120 and the stack of conductive layers 108 to form multiple cavity electrodes 128 over the semiconductor substrate 102. In various embodiments, the etching process comprises: forming a masking layer (not shown) over the dielectric protection layer 120; exposing unmasked regions of the dielectric protection layer 120 and the stack of conductive layers 108 to one or more etchants; and performing a removal process to remove the masking layer. In some embodiments, the etching process may include a wet etch, a dry etch, or the like. In various embodiments, the dielectric protection layer 120 may be configured as an etch stop layer during the etching process of FIG. 9 and due to the material and thickness t1 of the dielectric protection layer 120 damage to the stack of conductive layers 108 during the etching is mitigated.

Figure 10:
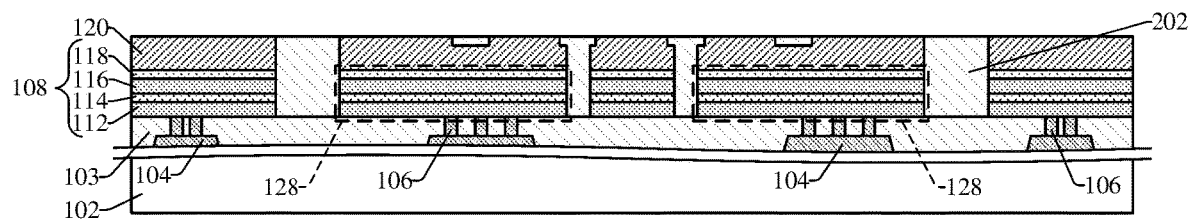

As shown in cross-sectional view 1000 of FIG. 10, a first dielectric layer 202 is formed over the lower dielectric structure 103. In some embodiments, the first dielectric layer 202 may, for example, be formed by CVD, PVD, ALD, or some other suitable deposition or growth process. The first dielectric layer 202 may, for example, be or comprise an oxide, silicon dioxide, a low-k dielectric, some other suitable material(s), or any combination of the foregoing. Further, after depositing the first dielectric layer 202 on the lower dielectric structure 103, a planarization process (e.g., a chemical mechanical planarization (CMP) process) may be performed on the first dielectric layer 202 such that a top surface of the first dielectric layer 202 is co-planar with a top surface of the dielectric protection layer 120. In various embodiments, the dielectric protection layer 120 may be configured as a planarization stop layer during the planarization process.

Figure 11:
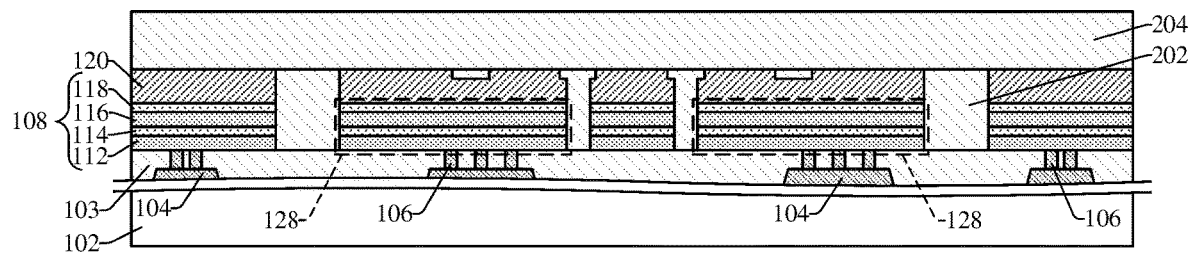

As shown in cross-sectional view 1100 of FIG. 11, a second dielectric layer 204 is formed over the first dielectric layer 202 and the dielectric protection layer 120. In some embodiments, the second dielectric layer 204 may, for example, be formed by CVD, PVD, ALD, or some other suitable deposition or growth process. The second dielectric layer 204 may, for example, be or comprise an oxide, silicon dioxide, a low-k dielectric, some other suitable material(s), or any combination of the foregoing. In further embodiments, a planarization process (e.g., a CMP process) may be performed on the second dielectric layer 204 to set the second dielectric layer 204 to a target thickness and planarize a top surface of the second dielectric layer 204 such that heights of subsequently formed cavities (e.g., cavities 130 of FIG. 12) are accurately defined.

Figure 12:
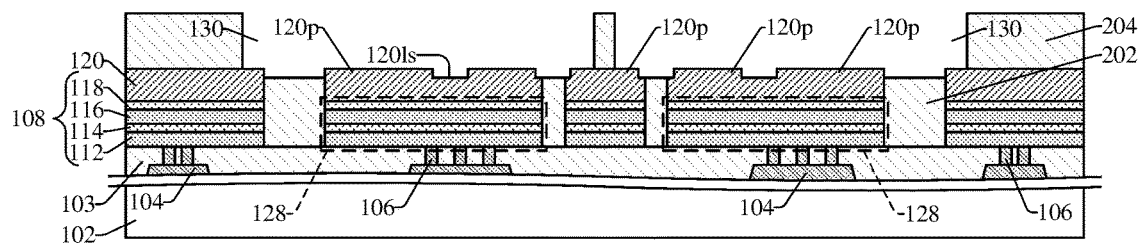

As shown in cross-sectional view 1200 of FIG. 12, an etching process is performed on the second dielectric layer 204 to form cavities 130 over the cavity electrodes 128. In various embodiments, the etching process includes: forming a masking layer (not shown) over the second dielectric layer 204; exposing unmasked regions of the second dielectric layer 204 to one or more etchants; and performing a removal process to remove the masking layer. The etching process may include a wet etch, a dry etch, or the like. Further, the etching process may expose the protrusions 120*p* of the dielectric protection layer 120.

Figure 13:
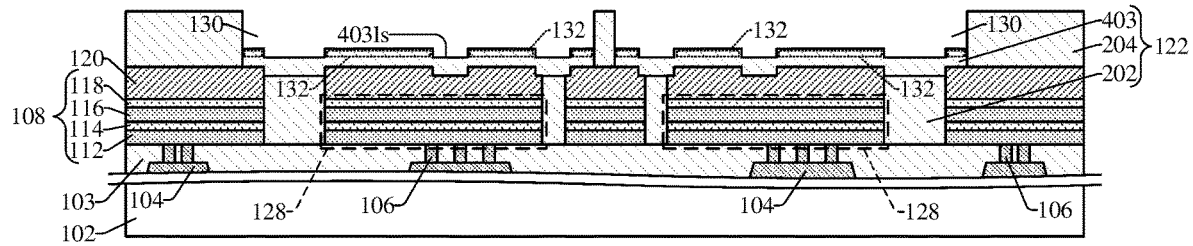

As shown in cross-sectional view 1300 of FIG. 13, a third dielectric layer 403 may be formed within the cavities 130 and over the dielectric protection layer 120, thereby defining a plurality of stopper structures 132 over the cavity electrodes 128 and defining an upper dielectric structure 122. The upper dielectric structure 122 comprises the first dielectric layer 202, the second dielectric layer 204, and the third dielectric layer 403. In various embodiments, the stopper structures 132 are segments of the third dielectric layer 403 and extend upward from a lower surface 403*ls* of the third dielectric layer 403. In further embodiments, forming the third dielectric layer 403 may include: depositing (e.g., by CVD, PVD, ALD, etc.) on the dielectric protection layer 120 and the second dielectric layer 204; and performing an etching process on the third dielectric layer 403 to remove the third dielectric layer 403 from regions outside of the cavities 130. In yet further embodiments, the third dielectric layer 403 may be selectively deposited in the cavities 130 (e.g., by utilizing a self-assembled monolayer (SAM)), may be formed by a lift-off process, or may be formed by some other suitable process(es).

Figure 14:
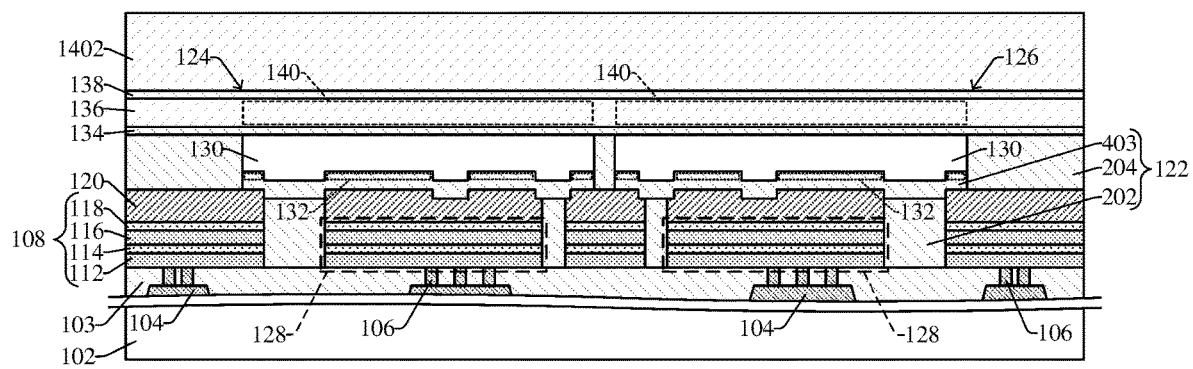

As shown in cross-sectional view 1400 of FIG. 14, a MEMS substrate 136 and handle substrate 1402 are provided and a bonding process is performed to bond the MEMS substrate 136 to the upper dielectric structure 122, thereby defining a first MEMS device 124 and a second MEMS device 126. The MEMS substrate 136 is disposed between a lower isolation structure 134 and an upper isolation structure 138. The handle substrate 1402 is disposed on the upper isolation structure 138 and is configured to provide structural support to the MEMS substrate 136 during the bonding process. The bonding process may include performing a fusion bonding process or some other suitable bonding process(es). Further, the MEMS substrate 136 comprises movable membranes 140. The MEMS substrate 136 is formed such that the movable membranes 140 are disposed over the cavities 130. In various embodiments, the bonding process seals the cavities 130 to a cavity pressure.

Figure 15:
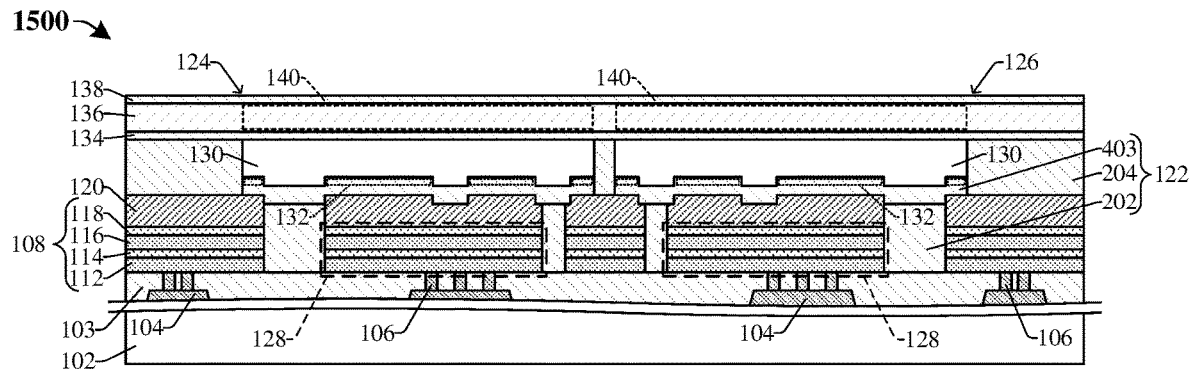

As shown in cross-sectional view 1500 of FIG. 15, a removal process is performed to remove the handle substrate (1402 of FIG. 14) from over the MEMS substrate 136. The removal process may, for example, include an etch process (e.g., a blanket etch), a planarization process (e.g., a CMP process), a grinding process (e.g., a mechanical grinding process), a combination of the foregoing, or another suitable removal process.

Figure 16:
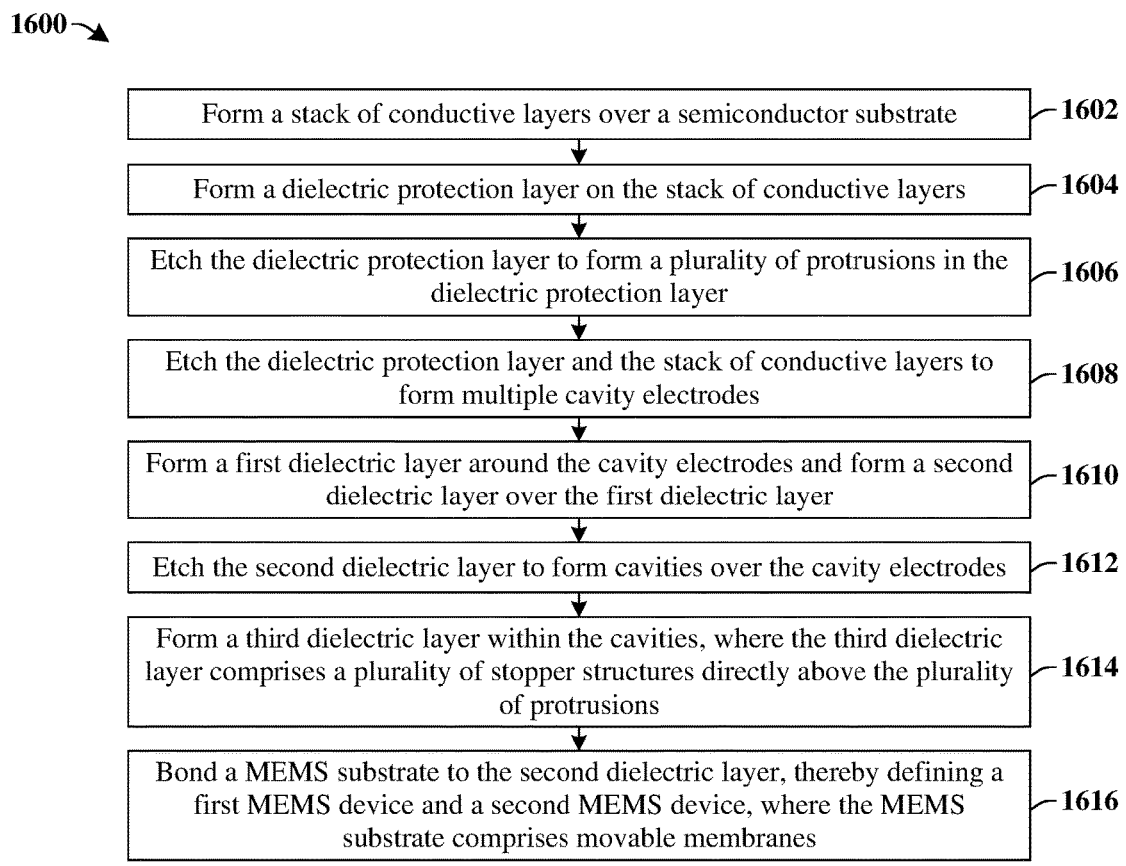
FIG. 16 illustrates some embodiments of a method for forming an integrated chip comprising a dielectric protection layer disposed along a top surface of a cavity electrode.

FIG. 16 illustrates some embodiments of a method 1600 for forming an integrated chip comprising a dielectric protection layer disposed along a top surface of a cavity electrode. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, a stack of conductive layers is formed over a semiconductor substrate. FIG. 6 illustrates a cross-sectional view 600 corresponding to some embodiments of act 1602.

At act 1604, a dielectric protection layer is formed on the stack of conductive layers. FIG. 7 illustrates a cross-sectional view 700 corresponding to some embodiments of act 1604.

At act 1606, the dielectric protection layer is etched to form a plurality of protrusions in the dielectric protection layer. FIG. 8 illustrates a cross-sectional view 800 corresponding to some embodiments of act 1606.

At act 1608, the dielectric protection layer and the stack of conductive layers are etched to form multiple cavity electrodes. FIG. 9 illustrates a cross-sectional view 900 corresponding to some embodiments of act 1608.

At act 1610, a first dielectric layer is formed around the cavity electrodes and a second dielectric layer is formed over the first dielectric layer. FIGS. 10 and 11 illustrate cross-sectional views 1000 and 1100 corresponding to some embodiments of act 1610.

At act 1612, the second dielectric layer is etched to form cavities over the cavity electrodes. FIG. 12 illustrates a cross-sectional view 1200 corresponding to some embodiments of act 1612.

At act 1614, a third dielectric layer is formed within the cavities, where the third dielectric layer comprises a plurality of stopper structures directly above the plurality of protrusions. FIG. 13 illustrates a cross-sectional view 1300 corresponding to some embodiments of act 1614.

At act 1616, a MEMS substrate is bonded to the second dielectric layer, thereby defining a first MEMS device and a second MEMS device, where the MEMS substrate comprises movable membranes. FIG. 14 illustrates a cross-sectional view 1400 corresponding to some embodiments of act 1616.

FIGS. 17-25 illustrate cross-sectional views 1700-2500 of some embodiments of a method for forming an integrated chip comprising a dielectric protection layer disposed along a top surface and sidewalls of a cavity electrode. Although the cross-sectional views 1700-2500 shown in FIGS. 17-25 are described with reference to a method, it will be appreciated that the structures shown in FIGS. 17-25 are not limited to the method but rather may stand alone separate of the method. Furthermore, although FIGS. 17-25 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 17:
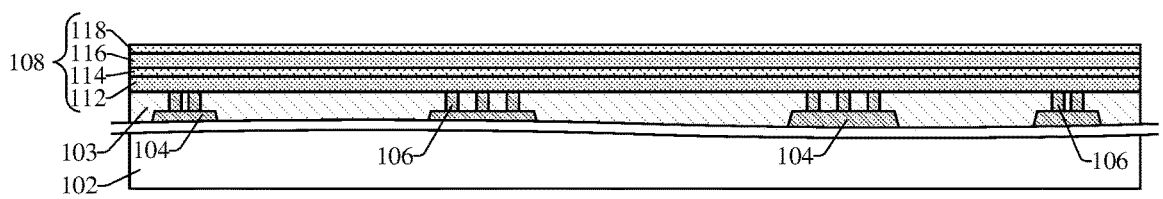
FIGS. 17-25 illustrate cross-sectional views of some embodiments of a method for forming an integrated chip comprising a dielectric protection layer disposed along a top surface and sidewalls of a cavity electrode.

As shown in cross-sectional view 1700 of FIG. 17, a semiconductor substrate 102 is provided. A lower dielectric structure 103, plurality of conductive wires 106, and plurality of conductive vias 106 are formed over the semiconductor substrate 102. Further, a stack of conductive layers 108 is formed over the lower dielectric structure 103. In some embodiments, the stack of conductive layers 108 comprises a first conductive layer 112, a second conductive layer 114, a third conductive layer 116, and a fourth conductive layer 118. A process for forming the stack of conductive layers 108 may include: depositing (e.g., by PVD, CVD, ALD, sputtering, or other deposition or growth process(es)) the first conductive layer 112 on the lower dielectric structure 103; depositing (e.g., by PVD, CVD, ALD, sputtering, or other deposition or growth process(es)) the second conductive layer 114 on the first conductive layer 112; depositing (e.g., by PVD, CVD, ALD, sputtering, or other deposition or growth process(es)) the third conductive layer 116 on the second conductive layer 114; and depositing (e.g., by PVD, CVD, ALD, sputtering, or other deposition or growth process(es)) the fourth conductive layer 118 on the third conductive layer 116.

Figure 18:
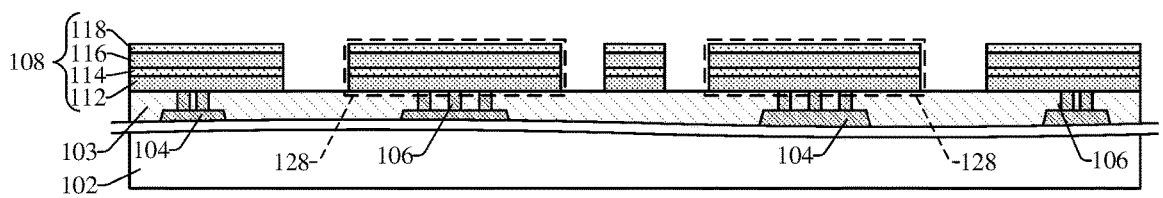

As shown in cross-sectional view 1800 of FIG. 18, an etching process is performed on the stack of conductive layers 108 to form multiple cavity electrodes 128 over the semiconductor substrate 102. In various embodiments, the etching process comprises: forming a masking layer (not shown) over the stack of conductive layers 108; exposing unmasked regions of the stack of conductive layers 108 to one or more etchants; and performing a removal process to remove the masking layer. In some embodiments, the etching process may include a wet etch, a dry etch, or the like.

Figure 19:
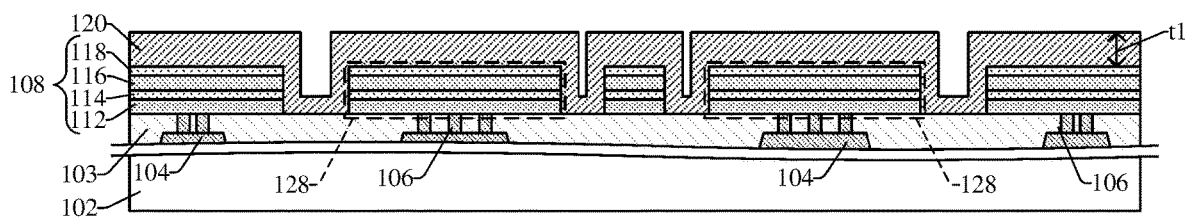

As shown in cross-sectional view 1900 of FIG. 19, a dielectric protection layer 120 is formed along top surfaces and sidewalls of the cavity electrodes 128. The dielectric protection layer 120 may, for example, be formed by CVD, PVD, ALD, or some other suitable deposition or growth process(es). The dielectric protection layer 120 may, for example, be or comprise a high-k dielectric (e.g., a dielectric material with a dielectric constant greater than about 3.9), silicon nitride, silicon carbide, aluminum oxide, tantalum oxide, titanium oxide, zirconium oxide, hafnium oxide, some other suitable dielectric material(s), or any combination of the foregoing. Further, the dielectric protection layer 120 may be formed to a thickness t1 that is, for example, within a range of about 300 angstroms to 1,500 angstroms, 1,000 angstroms to about 25,000 angstroms or some other suitable value.

Figure 20:
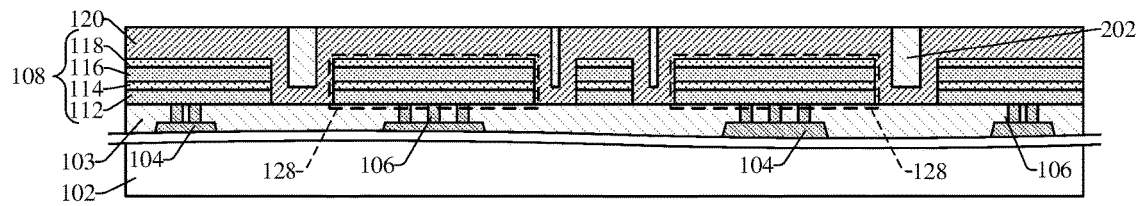

As shown in cross-sectional view 2000 of FIG. 20, a first dielectric layer 202 is formed over the dielectric protection layer 120. In some embodiments, the first dielectric layer 202 may, for example, be formed by CVD, PVD, ALD, or some other suitable deposition or growth process. The first dielectric layer 202 may, for example, be or comprise an oxide, silicon dioxide, a low-k dielectric, some other suitable material(s), or any combination of the foregoing. Further, after depositing the first dielectric layer 202 on the lower dielectric structure 103, a planarization process (e.g., a CMP process) may be performed on the first dielectric layer 202 such that a top surface of the first dielectric layer 202 is co-planar with a top surface of the dielectric protection layer 120. In various embodiments, the dielectric protection layer 120 may be configured as a planarization stop layer during the planarization process.

Figure 21:
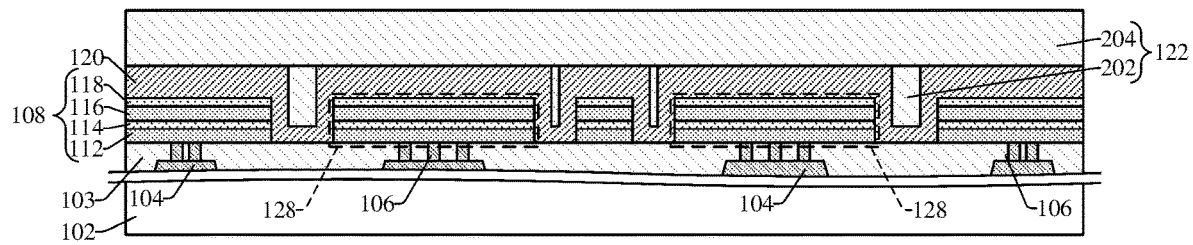

As shown in cross-sectional view 2100 of FIG. 21, a second dielectric layer 204 is formed over the first dielectric layer 202 and the dielectric protection layer 120, thereby defining an upper dielectric structure 122. The upper dielectric structure 122 comprises the first dielectric layer 202 and the second dielectric layer 204. In some embodiments, the second dielectric layer 204 may, for example, be formed by CVD, PVD, ALD, or some other suitable deposition or growth process. The second dielectric layer 204 may, for example, be or comprise an oxide, silicon dioxide, a low-k dielectric, some other suitable material(s), or any combination of the foregoing. In further embodiments, a planarization process (e.g., a CMP process) may be performed on the second dielectric layer 204 to set the second dielectric layer 204 to a target thickness and planarize a top surface of the second dielectric layer 204 such that heights of subsequently formed cavities (e.g., cavities 130 of FIG. 23) are accurately defined.

Figure 22:
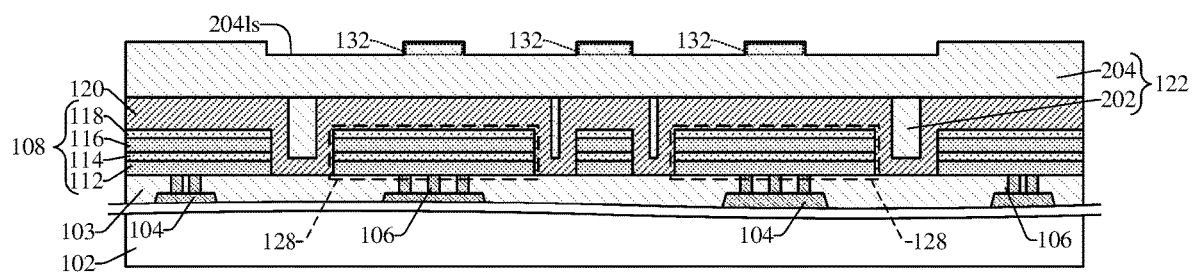

As shown in cross-sectional view 2200 of FIG. 22, an etching process is performed on the second dielectric layer 204 to form a plurality of stopper structures in the second dielectric layer 204. In some embodiments, the etching process may include a dry etch process, a wet etch process, some other suitable etch process(es), or any combination of the foregoing. Further, the protrusions extend upward from a lower surface 2041s of the second dielectric layer 204.

Figure 23:
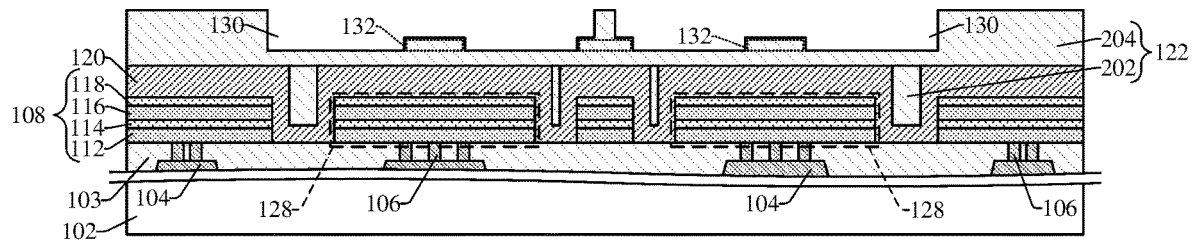

As shown in cross-sectional view 2300 of FIG. 23, an etching process is performed on the second dielectric layer 204 to form cavities 130 over the cavity electrodes 128. In various embodiments, the etching process includes: forming a masking layer (not shown) over the second dielectric layer 204; exposing unmasked regions of the second dielectric layer 204 to one or more etchants; and performing a removal process to remove the masking layer. The etching process may include a wet etch, a dry etch, or the like.

Figure 24:
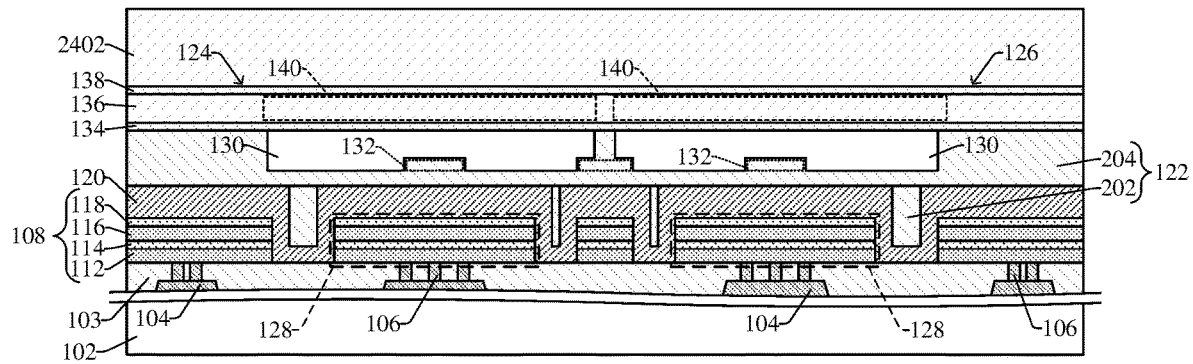

As shown in cross-sectional view 2400 of FIG. 24, a MEMS substrate 136 and handle substrate 2402 are provided and a bonding process is performed to bond the MEMS substrate 136 to the upper dielectric structure 122, thereby defining a first MEMS device 124 and a second MEMS device 126. The MEMS substrate 136 is disposed between a lower isolation structure 134 and an upper isolation structure 138. The handle substrate 2402 is disposed on the upper isolation structure 138 and is configured to provide structural support to the MEMS substrate 136 during the bonding process. The bonding process may include performing a fusion bonding process or some other suitable bonding process(es). Further, the MEMS substrate 136 comprises movable membranes 140. The MEMS substrate 136 is formed such that the movable membranes 140 are disposed over the cavities 130. In various embodiments, the bonding process seals the cavities 130 to a cavity pressure.

Figure 25:
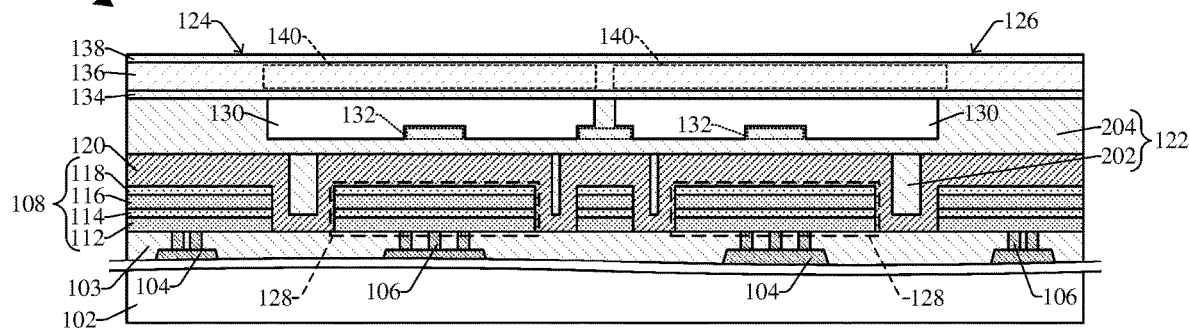

As shown in cross-sectional view 2500 of FIG. 25, a removal process is performed to remove the handle substrate (2402 of FIG. 24) from over the MEMS substrate 136. The removal process may, for example, include an etch process (e.g., a blanket etch), a planarization process (e.g., a CMP process), a grinding process (e.g., a mechanical grinding process), a combination of the foregoing, or another suitable removal process.

Figure 26:
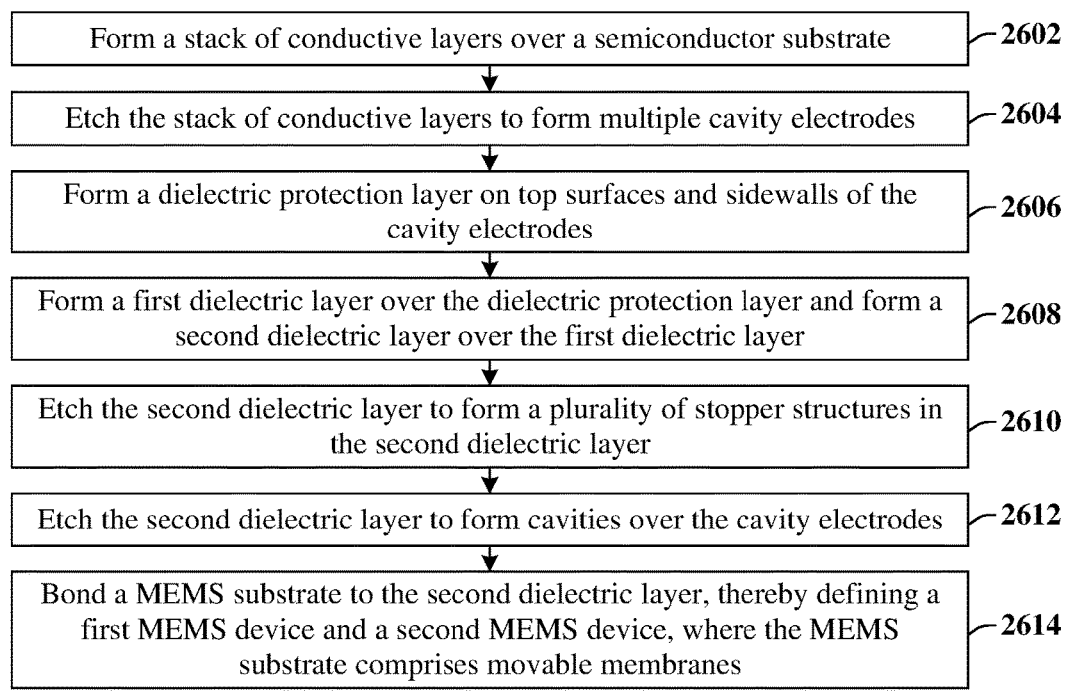
FIG. 26 illustrates some embodiments of a method for forming an integrated chip comprising a dielectric protection layer disposed along a top surface and sidewalls of a cavity electrode.

FIG. 26 illustrates some embodiments of a method 2600 for forming an integrated chip comprising a dielectric protection layer disposed along a top surface and sidewalls of a cavity electrode. Although the method 2600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2602, a stack of conductive layers is formed over a semiconductor substrate. FIG. 17 illustrates a cross-sectional view 1700 corresponding to some embodiments of act 2602.

At act 2604, the stack of conductive layers is etched to form multiple cavity electrodes. FIG. 18 illustrates a cross-sectional view 1800 corresponding to some embodiments of act 2604.

At act 2606, a dielectric protection layer is formed on top surfaces and sidewalls of the cavity electrodes. FIG. 19 illustrates a cross-sectional view 1900 corresponding to some embodiments of act 2606.

At act 2608, a first dielectric layer is formed over the dielectric protection layer and a second dielectric layer is formed over the first dielectric layer. FIGS. 20 and 21 illustrate cross-sectional views 2000 and 2100 corresponding to some embodiments of act 2608.

At act 2610, the second dielectric layer is etched to form a plurality of stopper structures in the second dielectric layer. FIG. 22 illustrates a cross-sectional view 2200 corresponding to some embodiments of act 2610.

At act 2612, the second dielectric layer is etched to form cavities over the cavity electrodes. FIG. 23 illustrates a cross-sectional view 2300 corresponding to some embodiments of act 2612.

At act 2614, a MEMS substrate is bonded to the second dielectric layer, thereby defining a first MEMS device and a second MEMS device, where the MEMS substrate comprises movable membranes. FIG. 24 illustrates a cross-sectional view 2400 corresponding to some embodiments of act 2614.

Accordingly, in some embodiments, the present disclosure relates to a microelectromechanical systems (MEMS) device having a dielectric protection layer disposed between a cavity electrode and a movable membrane.

In some embodiments, the present application provides an integrated chip including: a semiconductor substrate; an interconnect structure overlying the semiconductor substrate; an upper dielectric structure overlying the interconnect structure; a microelectromechanical system (MEMS) substrate overlying the upper dielectric structure, wherein a cavity is defined between the MEMS substrate and the upper dielectric structure, wherein the MEMS substrate comprises a movable membrane over the cavity; a cavity electrode disposed in the upper dielectric structure and underlying the cavity; a plurality of stopper structures disposed in the cavity between the movable membrane and the cavity electrode; and a dielectric protection layer disposed along a top surface of the cavity electrode, wherein the dielectric protection layer has a greater dielectric constant than the upper dielectric structure.

In some embodiments, the present application provides an integrated chip including: a semiconductor substrate; a lower dielectric structure overlying the semiconductor substrate; a cavity electrode disposed on the lower dielectric structure, wherein the cavity electrode comprises a stack of conductive layers; an upper dielectric structure disposed over and around the cavity electrode; a cavity disposed in the upper dielectric structure and overlying the cavity electrode;

a microelectromechanical system (MEMS) substrate disposed on the upper dielectric structure, wherein the MEMS substrate comprises a movable membrane over the cavity; and a dielectric protection layer disposed on and directly contacting a top surface of the cavity electrode, wherein a thickness of the dielectric protection layer is greater than a thickness of the upper dielectric structure directly over the cavity electrode.

In some embodiments, the present application provides a method for forming an integrated chip, the method includes: forming a stack of conductive layers over a semiconductor substrate, wherein a cavity electrode comprises a segment of the stack of conductive layers; depositing a dielectric protection layer on the cavity electrode, wherein the dielectric protection layer directly contacts a top surface of the cavity electrode; forming an upper dielectric structure over the dielectric protection layer, wherein a dielectric constant of the upper dielectric structure is less than a dielectric constant of the dielectric protection layer; etching the upper dielectric structure to form a cavity in the upper dielectric structure over the cavity electrode, wherein the dielectric protection layer remains on the top surface of the cavity electrode after etching the upper dielectric structure to form the cavity; and bonding a microelectromechanical system (MEMS) substrate to the upper dielectric structure, wherein the MEMS substrate comprises a movable membrane directly over the cavity electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   forming a stack of conductive layers over a semiconductor substrate, wherein a cavity electrode comprises a segment of the stack of conductive layers;
   depositing a dielectric protection layer on the cavity electrode, wherein the dielectric protection layer directly contacts a top surface of the cavity electrode;
   forming an upper dielectric structure over the dielectric protection layer, wherein a dielectric constant of the upper dielectric structure is less than a dielectric constant of the dielectric protection layer;
   etching the upper dielectric structure to form a cavity in the upper dielectric structure over the cavity electrode, wherein the dielectric protection layer remains on the top surface of the cavity electrode after etching the upper dielectric structure to form the cavity;
   etching the dielectric protection layer to from a plurality of protrusions in the dielectric protection layer that extend upward from a lower surface of the dielectric protection layer, wherein at least an individual protrusion in the plurality of protrusions is spaced laterally between outer sidewalls of the cavity electrode; and
   bonding a microelectromechanical system (MEMS) substrate to the upper dielectric structure, wherein the MEMS substrate comprises a movable membrane directly over the cavity electrode.

2. The method of claim 1, wherein the upper dielectric structure comprises a plurality of stopper structures that directly overlies the plurality of protrusions.

3. The method of claim 1, wherein the dielectric protection layer comprises a high-k dielectric.

4. The method of claim 1, wherein forming the cavity electrode comprises etching the stack of conductive layers while the dielectric protection layer is disposed on the stack of conductive layers.

5. The method of claim 1, wherein a thickness of the dielectric protection layer is greater than a thickness of a first conductive layer in the stack of conductive layers.

6. The method of claim 1, further comprising:
   forming an interconnect structure between the stack of conductive layers and the semiconductor substrate, wherein the interconnect structure comprises one or more conductive structures coupled to the cavity electrode.

7. The method of claim 1, wherein the dielectric protection layer is deposited along opposing sidewalls of the cavity electrode, wherein a bottom surface of the dielectric protection layer is aligned with a bottom surface of the cavity electrode.

8. The method of claim 1, wherein forming the upper dielectric structure comprises:
   depositing a first dielectric layer on the dielectric protection layer and around the cavity electrode;
   performing a planarization process on the first dielectric layer; and
   depositing a second dielectric layer on the first dielectric layer and the dielectric protection layer, wherein a thickness of the second dielectric layer directly over the cavity electrode is less than a thickness of the dielectric protection layer.

9. The method of claim 8, wherein a top surface of the first dielectric layer is co-planar with a top surface of the dielectric protection layer.

10. A method for forming an integrated chip, the method comprising:
    forming a stack of conductive layers over a semiconductor substrate, wherein a cavity electrode comprises a segment of the stack of conductive layers;
    depositing a dielectric protection layer on the cavity electrode, wherein the dielectric protection layer directly contacts a top surface of the cavity electrode, wherein forming the cavity electrode comprises etching the stack of conductive layers while the dielectric protection layer is disposed on the stack of conductive layers, wherein outer sidewalls of the cavity electrode are aligned with outer sidewalls of the dielectric protection layer;
    forming an upper dielectric structure over the dielectric protection layer, wherein a dielectric constant of the upper dielectric structure is less than a dielectric constant of the dielectric protection layer;
    etching the upper dielectric structure to form a cavity in the upper dielectric structure over the cavity electrode, wherein the dielectric protection layer remains on the top surface of the cavity electrode after etching the upper dielectric structure to form the cavity; and
    bonding a microelectromechanical system (MEMS) substrate to the upper dielectric structure, wherein the MEMS substrate comprises a movable membrane directly over the cavity electrode.

11. The method of claim 10, wherein forming the cavity electrode comprises:
performing a patterning process on the stack of conductive layers, wherein the patterning process defines the outer sidewalls of the cavity electrode, wherein the dielectric protection layer is deposited before the patterning process.

12. The method of claim 11, further comprising:
performing an etching process on the dielectric protection layer to form a plurality of protrusions extending upward in a direction away from the stack of conductive layers, wherein the etching process is performed before the patterning process, and wherein one or more of the protrusions directly overlie the cavity electrode.

13. The method of claim 12, further comprising:
forming one or more stopper structures directly over the cavity electrode by conformally depositing a dielectric layer on the plurality of protrusions after forming the cavity.

14. The method of claim 10, wherein the upper dielectric structure directly contacts the outer sidewalls of the cavity electrode and the outer sidewalls of the dielectric protection layer.

15. The method of claim 10, wherein forming the upper dielectric structure comprises:
forming a first dielectric layer around the cavity electrode and the dielectric protection layer, wherein a top surface of the first dielectric layer is above the top surface of the cavity electrode; and
forming a second dielectric layer over the dielectric protection layer, wherein etching the upper dielectric structure to form the cavity removes the second dielectric layer from over the cavity electrode, thereby exposing a top surface of the dielectric protection layer, wherein the second dielectric layer is laterally offset from the outer sidewalls of the dielectric protection layer.

16. A method for forming an integrated chip, the method comprising:
forming a stack of conductive layers over a semiconductor substrate, wherein a cavity electrode comprises a segment of the stack of conductive layers;
depositing a dielectric protection layer on the cavity electrode, wherein the dielectric protection layer directly contacts a top surface of the cavity electrode, wherein the dielectric protection layer is deposited after forming the cavity electrode and along opposing sidewalls of the cavity electrode, wherein a bottom surface of the dielectric protection layer is aligned with a bottom surface of the cavity electrode;
forming an upper dielectric structure over the dielectric protection layer, wherein a dielectric constant of the upper dielectric structure is less than a dielectric constant of the dielectric protection layer;
etching the upper dielectric structure to form a cavity in the upper dielectric structure over the cavity electrode, wherein the dielectric protection layer remains on the top surface of the cavity electrode after etching the upper dielectric structure to form the cavity; and
bonding a microelectromechanical system (MEMS) substrate to the upper dielectric structure, wherein the MEMS substrate comprises a movable membrane directly over the cavity electrode.

17. The method of claim 16, wherein a height of the dielectric protection layer directly over the cavity electrode is greater than a height of the cavity.

18. The method of claim 16, wherein a second cavity electrode comprises a second segment of the stack of conductive layers laterally offset from the cavity electrode by a first distance, wherein the dielectric protection layer continuously laterally extends from the cavity electrode to the second cavity electrode along the first distance.

19. The method of claim 16, wherein the dielectric protection layer comprises a U-shaped segment directly contacting a first sidewall of the opposing sidewalls of the cavity electrode.

20. The method of claim 16, wherein a vertical thickness of the dielectric protection layer on the top surface of the cavity electrode is greater than a lateral thickness of the dielectric protection layer along a first sidewall of the opposing sidewalls of the cavity electrode.

* * * * *